(12) United States Patent
Dobson et al.

(10) Patent No.: US 6,265,823 B1
(45) Date of Patent: Jul. 24, 2001

(54) LIGHT EMITTER

(75) Inventors: Peter James Dobson; Gareth Wakefield, both of Oxford (GB)

(73) Assignee: Isis Innovation Limited (GB)

( * ) Notice: Subject to any disclaimer, the term of this patent is extended or adjusted under 35 U.S.C. 154(b) by 0 days.

(21) Appl. No.: 09/115,624

(22) Filed: Jul. 14, 1998

(51) Int. Cl.$^7$ .................................................. H05B 33/14

(52) U.S. Cl. .......................... 313/501; 313/499; 313/503; 257/10; 257/21; 257/22

(58) Field of Search ..................................... 313/501, 499, 313/503; 257/10, 22, 21

(56) References Cited

U.S. PATENT DOCUMENTS 4,486,499 * 12/1984 Morimoto ......................... 313/499 X
4,801,994 * 1/1989 Van Gorkom et al. ........... 313/499 X

OTHER PUBLICATIONS

The fabrication and characterization of nickel oxide films and their application as contacts to polymer/porous silicon electroluminescent devices; G Wakefield, P.J. Dobson, Y Y Foo, A Simons and J.I. Hutchison; Semic. Sci. Technol. Dec. 1997 1304–1309, Printed in U.K.

* cited by examiner

Primary Examiner—Ashok Patel
(74) Attorney, Agent, or Firm—Nixon & Vanderhye P.C.

(57) ABSTRACT

The light emitter is fabricated from a silicon substrate (2) that has a layer of porous silicon (3) on its upper surface. A hole transporter (4) is applied to the upper surface of the porous silicon (2) and penetrates the channels (3') formed within the porous silicon. An upper semitransparent p-type material such as NiO is used as the upper contact (5) to the hole transporter and a further contact is formed on the base of the silicon wafer (2). The penetration of the hole transporter into the interstices between the silicon particles significantly improves the efficiency of the light emitter by up to two orders of magnitude. The light emitter is particularly suited to use in VLSI and display applications.

16 Claims, 1 Drawing Sheet

LIGHT EMITTER

Figure 1:
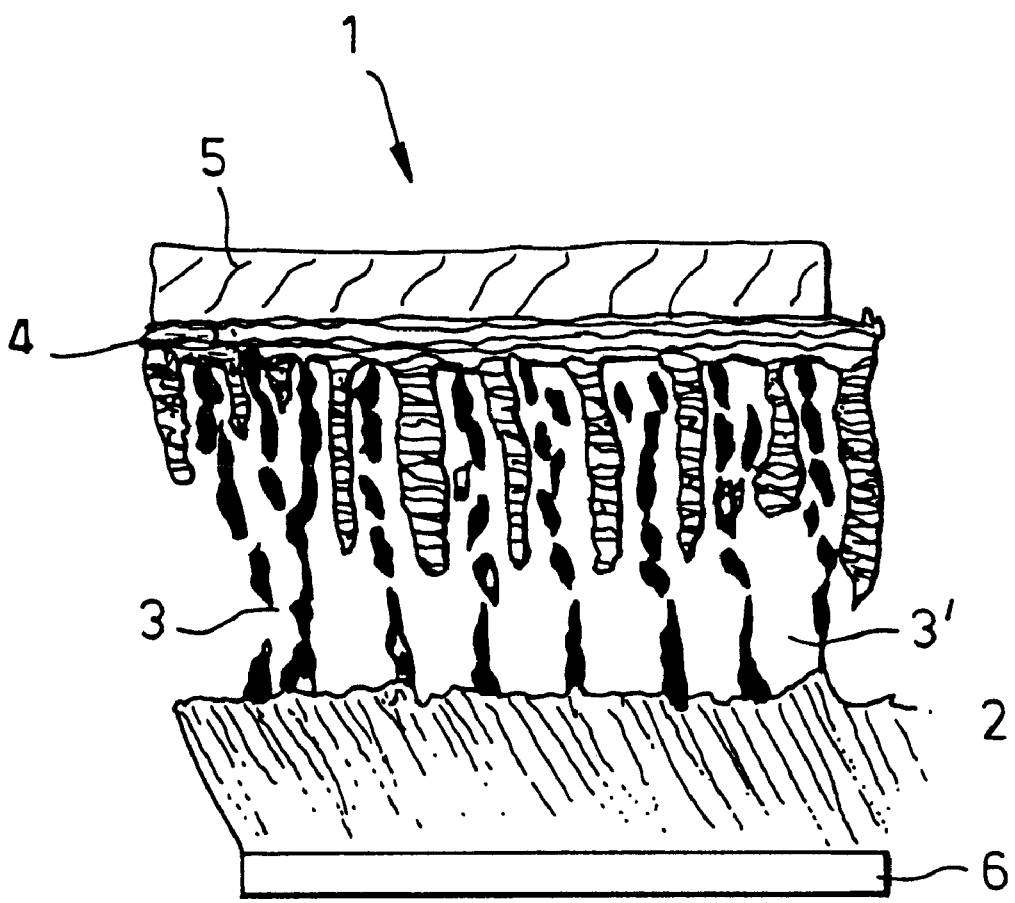

The present invention relates to a light emitter and in particular to a light emitter that relies upon quantum particle luminescence.

Light emitters based upon the injection of electrons and holes into a nanocomposite material in which small semiconductor particles (quantum particles) are embedded in a glass or polymer matrix have been developed commonly using porous silicon as the material of the semiconductor particles. Ideally, one of the electrodes is at least semi-transparent to allow the light generated by electron-hole recombination in the semiconductor particles to escape the device. To date the material in widespread use for forming the semi-transparent contact is indium tin oxide (ITO). ITO, though, along with all of the other semi-transparent contact materials currently considered, is a degenerate n-type semiconductor with a large electron affinity. The line-up of the energy levels between the n-type ITO and $SiO_2$/Si particle system is such that hole injection from the ITO will be extremely unlikely and very inefficient ($10^{-5}$–$10^{-6}$%). Moreover, existing light emitters encounter an additional problem in fabricating a reliable contact to the porous silicon because the porous silicon is such a fragile material.

Reference has been made above to semiconductor quantum particles. It is to be understood that in the context of this document reference to semiconductor quantum particles is intended as reference to semiconductor material in shapes having thicknesses in one or more dimensions approximately of the order of 1–50 nm.

The present invention seeks to provide a quantum particle light emitter having a greater efficiency than that of known quantum particle light emitters. The present invention also preferably seeks to overcome at least some of the disadvantages of known light emitters described above.

The present invention provides a light emitter comprising a substrate having an upper quantum particle layer containing semiconductor quantum particles that are electroluminescent on application of a biasing voltage; and first and second contacts with at least one of said contacts being at least partially transparent further characterised by a hole transporter provided between the upper quantum particle layer of the semiconductor material and said first contact wherein the hole transporter at least partially intermixes with the upper quantum particle layer.

With the present invention, the efficiency of the light emitter can be increased by around two orders of magnitude in comparison to conventional devices.

Preferably an n-type semiconductor material is used for the substrate and the upper quantum particle layer, for example silicon. More preferably, the upper quantum particle layer is made from porous silicon. A p-type semiconductor material may be used for the first contact, for example NiO. The hole transporter may be polyvinylcarbazole.

In a further aspect the present invention provides a method of fabricating a light emitter comprising: providing a quantum particle layer and a layer of a hole transporting material; applying one layer to the other to cause intermixing at the interface thereof; forming a first contact to the layer of hole transporting material and forming a second contact on the substrate.

In a preferred embodiment an upper layer of an n-type semiconductor material is anodised to form a porous upper quantum particle layer and the hole transporting layer is then applied so as to at least partially penetrate the porous upper quantum particle layer.

In an alternative preferred embodiment a polymer hole transporting layer is applied over the upper surface of the first contact and then a polymer material containing a suspension of quantum particles is spun coated over the top of the hole transporting layer whereby intermixing of the two layers at the interface occurs.

Embodiments of the present invention will now be described by way of example with reference to FIG. 1 which is a schematic drawing of a light emitter in accordance with the present invention.

The light emitter 1 shown in FIG. 1 consists of an n-type semiconductor substrate 2, preferably of n-type silicon, having an upper layer of porous silicon 3. Over the upper surface of the porous silicon 3 a hole transporter 4 is provided which at least partially penetrates the porous silicon. The hole transporter 4 is at least semi-transparent and in this embodiment consists of polyvinylcarbazole. It will be appreciated though that alternative semi-transparent materials capable of transporting positive charge carriers from a contact to the porous silicon also may be employed. First and second contacts 5 and 6 are provided on the upper surface of the hole transporter 4 and on the base of the substrate 2, respectively, to enable a biasing voltage to be applied across the light emitter 1. The first contact 5 is also at least semi-transparent and is of p-type semiconductor material. In the embodiment of FIG. 1 the first contact 5 consists of nickel oxide although alternative p-type semiconductor material also may be employed. The second contact 6 forms an ohmic contact with the substrate 2 and may consist of any suitable material.

Generally, the light emitter is fabricated by first forming the porous silicon using conventional techniques. The upper surface of the substrate may be anodised to a depth of around 1–10 μm using a solvent typically based on hydrofluoric acid. The pores formed in the silicon using this technique typically have diameters in the region of 1 to 100 nm and form channels 3'. The pores may then be further enlarged, although such enlargement is not essential, by chemical dissolution. The resultant layer of porous silicon 3 consists of a sponge like structure the walls of which are formed of silicon dioxide within which are embedded quantum particles of silicon. It is believed that the embedded silicon, within the silicon dioxide, forms columns that may break up into individual particles nearer to the upper surface of the porous silicon, as shown in FIG. 1. The wavelength of light emitted by the device can be controlled by the dependence on the size of the semiconductor quantum particles in the emitter. In the case of porous silicon visible light having wavelengths extending over the red to green spectrum can be generated depending on grain size.

The hole transporter 4, in this case polyvinylcarbazole (PVK), is then applied to the upper surface of the porous silicon by spin coating or dip coating, for example in an inert, dry atmosphere preferably containing a mixture of hydrogen and argon at room temperature and atmospheric pressure. A flat uniform layer of PVK approximately 100 nm thick is formed which partially penetrates and intermixes with the porous silicon 3 so that only around 20 to 30 nm of the PVK remains above the surface of the porous silicon. A layer of nickel oxide, being a p-type semiconductor, is then applied to the upper surface to the PVK to form the first contact 5. The nickel oxide NiO may be applied using known techniques such as thermal evaporation or sputtering in an oxygen rich environment. For example, layers of nickel oxide forming a film approximately 200 nm thick and having around 40% optical transparency can be formed by thermal evaporation of nickel oxide from a tantalum boat. The NiO layer should be continuous and uniform. The second contact 6 to the silicon substrate 2 may be formed using conventional techniques before or after fabrication of the first contact 5.

PVK is a preferred hole transporter in combination with a nickel oxide first contact because its valence band edge is higher than that of the nickel oxide, thus permitting the efficient transfer of holes from the nickel oxide. The external quantum efficiency of the light emitter using PVK is around $5 \times 10^{-3}\%$, two orders of magnitude higher than conventional devices using a simple ITO contact. The absorption edge of NiO is at 300 nm and the optical transmission is constant at 72% throughout the visible region of the spectrum. NiO films are also thermally stable up to temperatures of 150° C.

Although reference has been made above to the first contact 5 consisting of nickel oxide, alternative p-type semiconductor material which is partially transparent may be employed such as other transition metal oxides, for example Ruthenium oxide, and titanates when made under non-stoichiometric conditions. Also, despite the poor efficiency, ITO may be used as the contact material. Furthermore, the semiconductor material used in the fabrication of the first contact 5 may be doped, for example with lithium, to render the material more p-type.

One method for fabricating the light emitter of FIG. 1 is described below.

The porous silicon 3 was prepared using light assisted (tungsten halogen 800 W) anodization of an n-type silicon wafer ($\rho$=10–20 $\Omega$cm) in 40% HF in a dual-cell arrangement. The anodization proceeded at a current density of 3 mA cm$^{-2}$ for 5 mins, resulting in a microporous upper layer of approximately 0.8 $\mu$m thickness. The silicon wafer was dipped in ethanoic HF to remove any native oxide that may have formed after anodization.

Poly(9-vinylcarbazole) PVK was spun onto the porous layer at 3000 rpm for 20 s and the polymer layer was then given a short bake, approx. 15 mins at 65° C. in air to drive off any remaining solvent. A typical polymer formulation used is 10 mg PVK in 4 ml chloroform. The spin coating of the PVK was controlled to ensure penetration of the PVK into the porous upper layer of the silicon substrate.

NiO powder (99.99%) was then evaporated under an oxygen partial pressure (ranging from $5 \times 10^{-6}$ to $3 \times 10^{-4}$ Torr) from a tantalum crucible to form the top contact. This reaction can proceed very vigorously unless care is taken. In the case of NiO films evaporated onto a glass slide, the substrate is nominally at room temperature. For device fabrication the silicon substrate is held around –15° C. on a cold stage. As the temperature of the boat during evaporation is very high ($\approx$2000° C.), the cold stage acts as a heat sink and prevents any problems with the differing thermal expansion coefficients of the polymer and the NiO. It is important not to cool the substrate to lower temperatures than this to avoid the NiO film break-up during the re-heating to room temperature and there should be no damage to the underlying polymer layer. The fabricated device is sensitive to moisture and so should be stored under vacuum in a desiccator until use.

Where ITO is used instead of NiO, the ITO is applied by RF magnetron sputtering from a commercial target at room temperature to form a film of thickness 100–200 nm.

In an alternative method of fabricating a light emitter that relies upon quantum particle luminescence a thin coating of a p-type transparent semiconductor, for example NiO is applied to a glass surface to form a first contact. A layer of a hole transporting polymer such as PVK is then spin coated on top of the first contact. Thereafter a layer of a colloid of semiconductor quantum particles in a polymer such as PMMA or polystyrene is spin coated over the hole transporting layer. Preferably, the polymer used in the colloid is one that does not readily conduct either electrons or holes so that both types of charge carriers are forced into the quantum particles. Intermixing occurs at the interface of the hole transporting layer and the colloid layer so that the hole transporting layer partially penetrates into the colloid layer. An electron transporting layer such as oxadiazole derivatives e.g. 2-(4'-tertbutylphenyl)-5-(4"-biphenyl)-1,3,4-oxadiazole (PBD) is then spun coated over the quantum particle layer and finally a low work function metal, for example Ca or Mg is evaporated over the electron transporting layer with a protective layer of aluminium of silver for example to form the second contact. Each of the polymer layers is preferably around 0.1 $\mu$m deep with a penetration depth of one polymer layer into the next of up to 100 nm.

Since n-type semiconductor quantum particles are being used in the light emitter described above in combination with a p-type contact, there is no barrier to the flow of positive charge carriers from the first contact to the quantum particles and so the efficiency of the light emitter is much greater than with conventional quantum particle light emitters. In addition, the inclusion of the hole transporter which partially intermixes with the quantum particle layer to a depth of up to 100 nm improves the delivery of the positive charge carriers to the quantum particles and so increases the output of the device by two orders of magnitude. This layer can also strengthen the structure of the emitter.

With the light emitter described above, hole injection from the first contact through the hole transporter and electron injection from the second contact to the quantum particles particles is generated when a biasing voltage is applied across the device. Where porous silicon is used for the quantum particles, the silicon dioxide of the walls of the porous silicon is believed to be sufficiently thin that it does not act as a barrier to the flow of charge carriers. The recombination of the holes and electrons in the quantum particles results in the emission of light that emerges through the hole transporter and the first contact. Electroluminescence can be achieved with biasing voltages from around 5 volts. For example, in experiment an orange light was emitted with an emitter having a top contact area of around 7 mm$^2$ with a biasing voltage of 20 volts at 10 mA. In general, with NiO as the contact switch on voltages from 5 to 15 volts are possible compared to 55–60 volts for ITO contacts.

Whilst reference is made herein to silicon alternative substrate materials including polymers and composite materials may be employed, for example polyparaphenylenevinylene (PPV) and related compounds. Furthermore, alternative materials for the quantum particle layer includes CdSe, CdS, GaAs, InP etc embedded in polymers such as PPV or PVK etc. Finally, the substrate or electron transporting layer may consist of a heavily doped n-type semiconductor (such as silicon) or it can be a metallic support with a low work function metal layer (e.g. MG, Ca, Na, Cs etc.) adjacent to the substrate.

The light emitter described above is particularly suited for use in VLSI and display technologies.

What we claim is:

1. A light emitter comprising a substrate having an upper quantum particle layer containing semiconductor quantum particles that are electroluminsescent on application of a biasing voltage; and first and second contacts with at least one of said contacts being at least partially transparent further characterised by a hole transporter provided between the upper quantum particle layer of the semiconductor material and said first contact wherein the hole transporter at least partially intermixes with the upper quantum particle layer.

2. A light emitter as claimed in claim 1, wherein the first contact is of a p-type semiconductor material.

3. A light emitter as claimed in claim 2, wherein the first contact consists of NiO.

4. A light emitter as claimed in claim 1, wherein the quantum particle layer is between 1 and 10 µm deep.

5. A light emitter as claimed in claim 1, wherein the quantum particle layer consists of porous silicon.

6. A light emitter as claimed in claim 5, wherein the pores of the porous silicon layer have diameters between 1 and 100 nm.

7. A light emitter as claimed in claim 1, wherein the hole transporter consists of polyvinylcarbazole.

8. A light emitter as claimed in claim 1, wherein the quantum particle layer consists of porous silicon and the hole transporter penetrates the porous silicon layer to a depth of 100 nm.

9. A display which includes a light emitter, wherein said light emitter comprises:

a substrate having an upper quantum particle layer containing semiconductor quantum particles that are electroluminsescent on application of a biasing voltage;

first and second contacts with at least one of said contacts being at least partially transparent; and a hole transporter provided between the upper quantum particle layer of the semiconductor material and said first contact, wherein the hole transporter at least partially intermixes with the upper quantum particle layer.

10. The display of claim 9, wherein the first contact is of a p-type semiconductor material.

11. The display of claim 15, wherein the first contact consists of NiO.

12. The display of claim 9, wherein the quantum particle layer is between 1 and 10 µm deep.

13. The display of claim 9, wherein the quantum particle layer consists of porous silicon.

14. The display of claim 13, wherein the pores of the porous silicon layer have diameters between 1 and 100 nm.

15. The display of claim 9, wherein the hole transporter consists of polyvinylcarbazole.

16. The display of claim 9, wherein the quantum particle layer consists of porous silicon and the hole transporter penetrates the porous silicon layer to a depth of 100 nm.

\* \* \* \* \*